(12) United States Patent
Oyama

(10) Patent No.: US 9,972,992 B2
(45) Date of Patent: May 15, 2018

(54) PROTECTION CIRCUIT OF SEMICONDUCTOR DEVICE

(71) Applicant: DENSO CORPORATION, Kariya, Aichi-pref. (JP)

(72) Inventor: Kazuhiro Oyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 199 days.

(21) Appl. No.: 14/894,710

(22) PCT Filed: May 28, 2014

(86) PCT No.: PCT/JP2014/002813
§ 371 (c)(1),
(2) Date: Nov. 30, 2015

(87) PCT Pub. No.: WO2014/196165
PCT Pub. Date: Dec. 11, 2014

(65) Prior Publication Data
US 2016/0126723 A1  May 5, 2016

(30) Foreign Application Priority Data
Jun. 7, 2013  (JP) ................. 2013-120711

(51) Int. Cl.
H02H 7/00 (2006.01)
H03K 17/0812 (2006.01)
(Continued)

(52) U.S. Cl.
CPC ......... *H02H 7/003* (2013.01); *H01L 27/0248* (2013.01); *H01L 29/7408* (2013.01);
(Continued)

(58) Field of Classification Search
CPC .............. H02H 7/003; H03K 17/08122; H01L 27/0248; H01L 29/7408; H01L 29/7412; H01L 29/778
See application file for complete search history.

(56) References Cited

U.S. PATENT DOCUMENTS 4,160,920 A * 7/1979 Courier de Mere .. H02M 3/135
327/470
5,304,802 A 4/1994 Kumagai
(Continued)

FOREIGN PATENT DOCUMENTS

JP  2009-246276 A  10/2009
JP  2011-211096 A  10/2011

OTHER PUBLICATIONS

International Search Report of the International Searching Authority dated Jul. 22, 2014 issued in the corresponding International application No. PCT/JP2014/002813 (and English translation).
(Continued)

Primary Examiner — Zeev V Kitov
(74) Attorney, Agent, or Firm — Posz Law Group, PLC

(57) ABSTRACT

A protection circuit of a semiconductor device includes a high electron mobility transistor and a protection element. Between the drain and the gate of the high electron mobility transistor, the protection element includes: a thyristor; and a first resistor connected in series to the thyristor. Between the source and the gate of the high electron mobility transistor, the protection element includes: a second resistor and an interrupter that is connected in series to the second resistor. The interrupter interrupts a flow of a current between the drain and the gate when the thyristor is turned off, and the interrupter permits the current to flow between the drain and the gate when the thyristor is turned on.

9 Claims, 3 Drawing Sheets

(51) Int. Cl.
*H01L 27/02* (2006.01)
*H01L 29/74* (2006.01)
*H01L 29/778* (2006.01)

(52) U.S. Cl.
CPC ........ *H01L 29/7412* (2013.01); *H01L 29/778* (2013.01); *H03K 17/08122* (2013.01)

(56) References Cited

U.S. PATENT DOCUMENTS

| | | |
|---|---|---|
| 5,324,971 A | 6/1994 | Notley |
| 5,365,099 A | 11/1994 | Phipps et al. |
| 5,631,187 A | 5/1997 | Phipps et al. |
| 9,099,862 B1 * | 8/2015 | Ozard .................... H02H 9/046 |
| 2002/0018328 A1 | 2/2002 | Nakamura et al. |
| 2007/0023779 A1 | 2/2007 | Hirose et al. |
| 2008/0062595 A1 * | 3/2008 | Ping .................... H01L 27/0266 |
| | | 361/56 |
| 2009/0166677 A1 | 7/2009 | Shibata et al. |
| 2011/0204381 A1 | 8/2011 | Okada et al. |
| 2011/0204415 A1 * | 8/2011 | Van Wijmeersch .... H01L 29/87 |
| | | 257/154 |
| 2012/0236449 A1 | 9/2012 | Ping et al. |
| 2012/0273797 A1 | 11/2012 | Okada et al. |
| 2013/0313564 A1 | 11/2013 | Okada et al. |

OTHER PUBLICATIONS

Written Opinion of the International Searching Authority dated Jul. 22, 2014 issued in the corresponding International application No. PCT/JP2014/002813 (and English translation).

* cited by examiner

PROTECTION CIRCUIT OF SEMICONDUCTOR DEVICE

CROSS REFERENCE TO RELATED APPLICATION APPLICATIONS

This application is a U.S. national stage of International Application No. PCT/JP2014/002813 filed on May 28, 2014 and is based on Japanese Patent Application No. 2013-120711 filed on Jun. 7, 2013, the disclosures of which are incorporated herein by reference.

TECHNICAL FIELD

The present disclosure relates to a protection circuit of a semiconductor device that has a semiconductor switching element consisting of a high electron mobility transistor (henceforth termed as HEMT).

BACKGROUND ART

In the case where the semiconductor switching element is connected to an inductive load and turn-on and -off of electric power supply to the inductive load is controlled by the semiconductor switching element, it is necessary to consume energy accumulated in the inductive load within the circuit at the time of turn-off. Energy E accumulated at this time becomes $E=\frac{1}{2} \times LI_2$ with self-inductance and a current being designated as L and I.

In the case where the semiconductor switching element is a MOSFET consisting of silicon, it takes a device structure having a spurious diode of an anti-parallel connection where its cathode is connected to its drain and its anode is connected to its source between the drain and the source. Therefore, since energy from the inductive load can be consumed employing an avalanche area of a parasitic diode when the MOSFET is turned OFF, the MOSFET semiconductor switching element has comparatively large avalanche maximum energy.

Incidentally, the avalanche maximum energy is an index of a breakdown endurance amount of the device, and is defined as a maximum energy that the device can consume without resulting in breakdown when the device consumes the energy accumulated in the inductive load.

In contrast, in the case where GaN-HEMT or GaAs-HEMT made of compound semiconductors is used as the semiconductor switching element, usually, the energy from the inductive load cannot be consumed inside the element, and exceeds the avalanche maximum energy between the gate and the drain (BVgd) and a source-drain breakdown voltage (Bvdsoff), which brings about element breakdown. Therefore, in a system of an inductive load with self-inductance L, such as an inverter, it is ordinary that the semiconductor switching element is used together with the protecting element.

For example, there is a method whereby an external diode is anti-parallel connected between the source and the drain of the HEMT as the protecting element. This method realizes the same structure as that of the MOSFET of silicon by including an external diode, and the structure consumes the energy from the inductive load. However, since energy when the HEMT is turned OFF from a state where a rated current is flowed to the HEMT will be consumed by the diode side, a large current comparable with that of the HEMT is required to flow in the diode, which poses a difficulty that the diode becomes large in size.

Therefore, Patent Literature 1 proposes a structure in which Zener diodes are anti-parallel connected between the gate and the drain and between the source and the gate as the protecting element. By this method, when a drain voltage increases by energy of the inductive load, at the same time of breakdown of the Zener diode between the gate and the drain, the Zener diode between the source and the gate also breaks down and a breakdown current flows. A voltage that is divided according to the number of stages of the Zener diodes is applied to the HEMT as a gate voltage. This breakdown current charges the gate like the case where the HEMT normally turns ON, which opens the channel and makes the HEMT turn ON. That is, the energy of the inductive load is consumed by the HEMT by making the HEMT turn ON. Therefore, the Zener diode only needs to be configured so as to flow a small current that can drive the HEMT, and therefore the size of the diode can be made small.

PRIOR ART LITERATURES

Patent Literature

Patent Literature 1: Japanese Patent Application Laid-Open No. 2009-164158

SUMMARY OF INVENTION

However, even with the structure in Patent Literature 1, a current of such an extent as to supply sufficient electric power to drive the gate is required. In the case where a high breakdown voltage element among semiconductor switching elements is protected, diodes of a very large number of stages are required. For example, if a blocking voltage of some hundreds volts [V] is intended to be obtained, the number of stages of diodes will become a few tens to few hundreds stages, which are extraordinary large in number. In a protection state, although a breakdown current flows, since the breakdown current flows in a reverse direction to the diodes of a large number of stages, a resistance that the current suffers becomes dramatically large. Therefore, the current does not become large as expected, so that the diodes will need to be enlarged in order to flow a sufficient current to drive the semiconductor switching element.

Incidentally, there is a structure where diodes are connected parallel in a forward direction between a gate and a drain and between a source and the gate. With this structure, the diodes are arranged in the forward direction, it becomes possible to flow a comparatively large current. However, in order to protect the high breakdown voltage element, the number of stages of diodes must be increased further, and the diodes will become large. Moreover, in this structure, the number of stages of diodes can also be decreased by connecting MIS transistors in parallel between the gate and the source and between the source and the gate instead of the diodes. However, a current that can be flowed when the MIS transistor breaks down at the time of serge protection is not large, and if a sufficient current to drive the semiconductor switching element is intended to be flowed, a large MIS transistor becomes necessary. That is, the structure like this is a structure that supposes a low breakdown voltage, and is not a structure suitable for a high breakdown voltage.

In view of the above-mentioned point, the present invention is to provide a protection circuit of a semiconductor device that can obtain avalanche maximum energy while suppressing increase in size of a protecting element.

OBJECTS TO BE SOLVED BY THE INVENTION

The protection circuit of a semiconductor device according to one mode of the present invention includes a high electron mobility transistor and the protecting element. The high electron mobility transistor is connected to a load and acts as the semiconductor switching element that controls turn-on and -off of electric power supply to the load. The protecting element includes a thyristor forward connected and a first resistor serially connected to the thyristor between the drain and the gate of the high electron mobility transistor. The protecting element includes a second resistor and an interrupter serially connected to the second resistor between the source and the gate of the high electron mobility transistor. The interrupter interrupts a flow of a current between the drain and the gate during the thyristor is OFF, and permits the flow of the current between the drain and the gate during the thyristor is ON.

The protection circuit of a semiconductor device can achieve the avalanche maximum energy while suppressing the increase in size of the protecting element.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
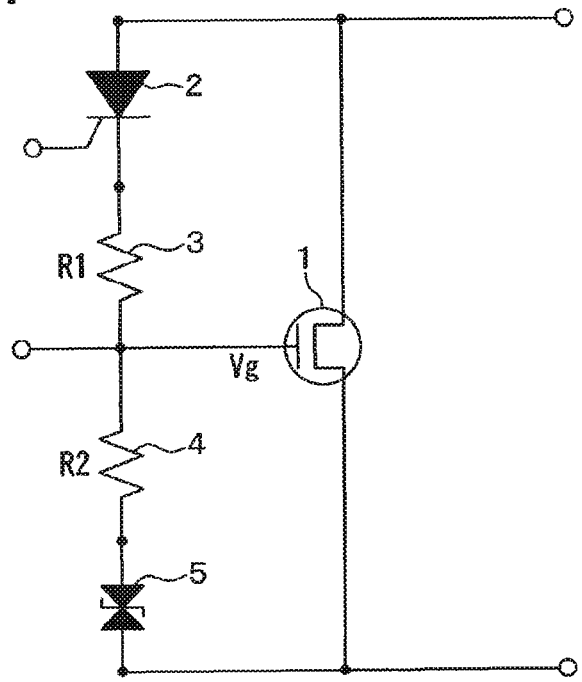
FIG. 1 is a circuit diagram of a protection circuit of a semiconductor device according to a first embodiment of the present invention.

Hereinafter, embodiments of the present invention will be explained based on diagrams. Incidentally, between respective embodiments illustrated below, explanations are given while mutually the same or equal portions are denoted by an identical reference numeral.

First Embodiment

A protection circuit of a semiconductor device according to a first embodiment of the present invention will be explained. As in FIG. 1, the protection circuit is configured to include a HEMT 1 as a semiconductor switching element that is to be protected and also to be provided with protecting elements between a drain and a gate and between a source and the gate of the HEMT 1.

The HEMT 1 is driven to be ON and OFF based on a gate driving signal from the outside, and controls, for example, turn-on and -off of electric power supply to an inductive load (unillustrated) connected between the drain and the source.

The HEMT 1 is formed using a structure such that a GaN layer acting as an electron transit layer and an n-type AlGaN layer acting as an electron supply layer are layered on a surface of a substrate, for example, Si (111) and GaAs as a compound semiconductor substrate. Then, a recess shaped part is formed on a surface of the AlGaN layer, a gate electrode is arranged in the recess shaped part, and in addition a source electrode and a drain electrode are formed at both sides that interpose the gate electrode. Incidentally, although the one example of the HEMT 1 was illustrated here, the HEMT 1 may be made of any kind of materials such as of GaN-HEMT and GaAs-HEMT.

Between the drain and the gate of the HEMT 1, a thyristor 2 and a first resistor 3 that are serially connected with each other are provided as the protecting element.

In this embodiment, the thyristor 2 is arranged at the high side of the first resistor 3, and is forward connected between the drain and the gate of the HEMT 1. The thyristor 2 is specified to have a pnpn structure, and performs an operation that the thyristor 2 turns ON when a voltage equal to or higher than a breakover voltage $V_{BF}$ (a forward breakdown voltage) is applied between its anode and cathode and maintains an ON state even without a base current after it turns ON. When the thyristor 2 turns ON, an anode-cathode voltage of the thyristor 2 decreases to a voltage Vh that can be ignored in comparison with breakover voltage $V_{BF}$, and becomes somewhat larger when the current $I_{AC}$ flowing between the anode and the cathode becomes larger, but it is of an amount that is almost negligible. Then, the thyristor 2 becomes off when the current $I_{AC}$ that flows between the anode and the cathode falls to equal to or less than a holding current Ih. A drain voltage is configured to be clamped by making the thyristor 2 turn ON when the drain voltage of the HEMT 1 reaches a predetermined voltage at the time of turn-off by using the thyristor 2 performing such an operation. Thereby, this configuration avoids a voltage exceeding the clamp voltage from being applied to the HEMT 1.

Incidentally, a base of the thyristor 2 can be chosen to be either: the base is set to an open state according to a leakage current $I_s$ (refer to FIG. 2) and the breakdown voltage, or the base is short-circuited to a cathode of the thyristor 2. That is, when the base of the thyristor 2 is set to the open state, it causes the leakage current $I_s$ to increase; therefore, if the thyristor 2 is made large in breakdown voltage, a calorific value will increase. In contrast to this, when the base of the thyristor 2 is short-circuited to the cathode, as compared with the case of being set to the open state, the leakage current $I_s$ can be made small. Therefore, what is necessary is just to choose whether the base of the thyristor 2 is set to the open state, or it is short-circuited to the cathode in consideration of heat resistance of the thyristor 2.

The first resistor 3 is serially connected to the thyristor 2, and is used in order to decide a current that flows through the thyristor 2 at the time of clamping together with a second resistor 4 that will be mentioned later. Moreover, the first resistor 3 also plays a role of deciding a gate voltage Vg of the HEMT 1 at the time of turn-off by acting as a voltage dividing resistance that divides a drain-source voltage of the HEMT 1 together with the second resistor 4.

In contrast, between the source and the gate of the HEMT 1, the second resistor 4 and a Zener diode 5 that are serially connected with each other are provided as the protecting element.

The second resistor 4 is thus used in order to decide a current that flows through the thyristor 2 together with the first resistor 3 at the time of the clamping. In addition, the second resistor 4 also plays a role of deciding the gate voltage of the HEMT 1 at the time of turn-off by acting as a voltage dividing resistance that divides the drain-source voltage of the HEMT 1 together with the first resistor 3.

The Zener diode 5 is equivalent to an interrupter and is configured so that the gate voltage Vg may be applied to the HEMT 1 by the Zener diode 5 being interrupted when the HEMT 1 is made to turn ON in order to supply electric power to the load. In addition, the Zener diode 5 also performs a roll of allowing a current to flow into the protecting element side by being made conductive when the thyristor 2 turns ON at the time of turn-off of the HEMT 1. In the case of this embodiment, the Zener diode 5 is configured to have the breakdown voltage that is higher than the gate voltage of the HEMT 1 at the time of ON. Therefore, the thyristor 2 is configured so that at the time of turn-off, when the thyristor 2 becomes conductive, a current may be allowed to flow in a path that communicates the thyristor 2, the first and second resistances, and the Zener diode 5, and at the time of turn-on, the gate voltage can be applied to the HEMT 1. Moreover, in this embodiment, the Zener diodes 5 are configured to be set in back-to-back connection where mutual cathodes are connected, and are made able to cope with a case where the HEMT 1 is turned off by applying a negative voltage thereto when the HEMT 1 is intended to be gate-off.

Next, an operation of the protection circuit of a semiconductor device will be explained.

First, when the HEMT 1 is made ON based on the gate driving signal (the gate voltage Vg) from the outside, the inductive load is driven based on electric power supply from a power source (not illustrated), and the circuit is in a state where energy is accumulated to the inductive load. Then, the HEMT 1 is turned OFF by a change of the gate driving signal, for example, an event that the gate voltage Vg switches from a high level to a low level. At this time, it is necessary to consume the energy accumulated in the inductive load within the circuit.

In contrast to this, in this embodiment, since the protection circuit includes the above configuration, when a voltage equal to or higher than the breakover voltage $V_{BF}$ is applied between the anode and the cathode of the thyristor 2 at the time of turn-off of the HEMT 1, the thyristor 2 is made to turn ON. Then, when the thyristor 2 is made to turn ON, a voltage that is divided by the first resistor 3 and the second resistor 4 is applied as the gate voltage Vg of the HEMT 1, which makes the HEMT 1 turn ON. Therefore, the drain voltage of the HEMT 1 can be clamped by a forward-direction breakdown voltage of the thyristor 2, and it can be made possible that the voltage exceeding the clamp voltage may not be applied to the HEMT 1.

Figure 2:
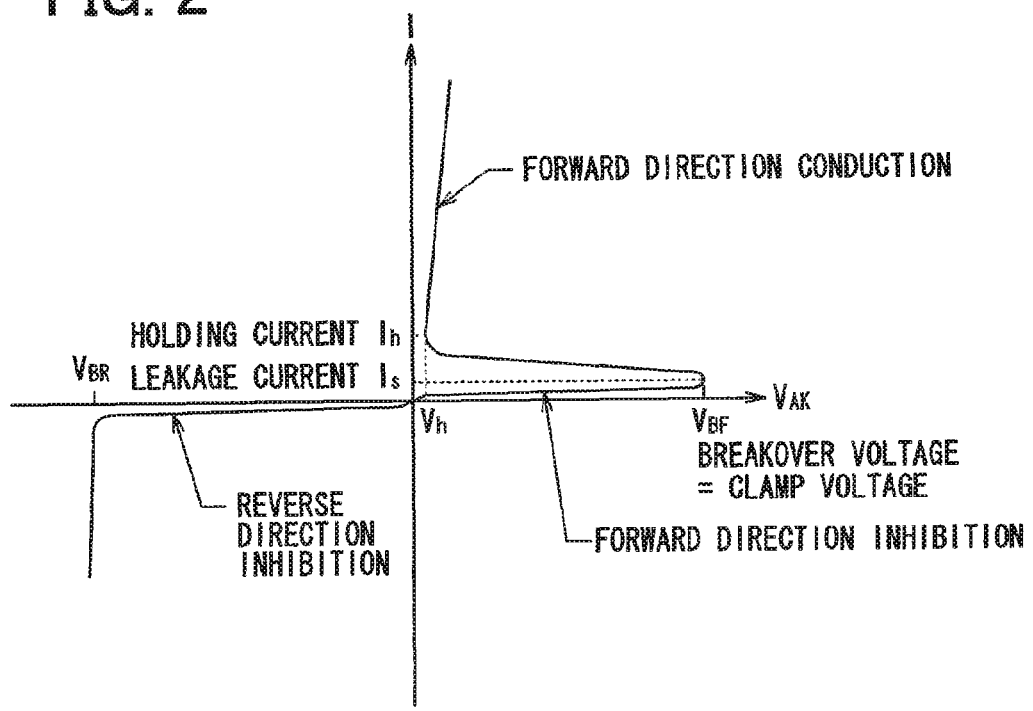
FIG. 2 is a diagram representing a characteristic line that illustrates a relationship of a voltage $V_{AK}$ and a current I between an anode and a cathode of a thyristor.

Moreover, as in FIG. 2, the thyristor 2 performs an operation of maintaining the ON state even without the base current after the thyristor 2 turns ON by a voltage equal to or higher than the breakover voltage $V_{BF}$ being applied between its anode and cathode. Then, once the thyristor 2 turns ON and the drain voltage is clamped, a drop voltage in the thyristor 2, i.e., the anode-cathode voltage, will fall to the voltage Vh of such an amount as can be ignored as compared with the breakover voltage $V_{BF}$. Although this voltage becomes somewhat larger when the current $I_{AC}$ flowing between the anode and the cathode becomes larger, it is of an amount that is almost negligible. Therefore, the current flowing in the protection circuit at the time of the clamping will be made to be decided by a resistance value R1 of the first resistor 3 and a resistance value R2 of the second resistor 4, which enables to freely design a current flowing in the protecting element, from a small current to a large current, by appropriately choosing these resistance values R1, R2.

Figure 3:
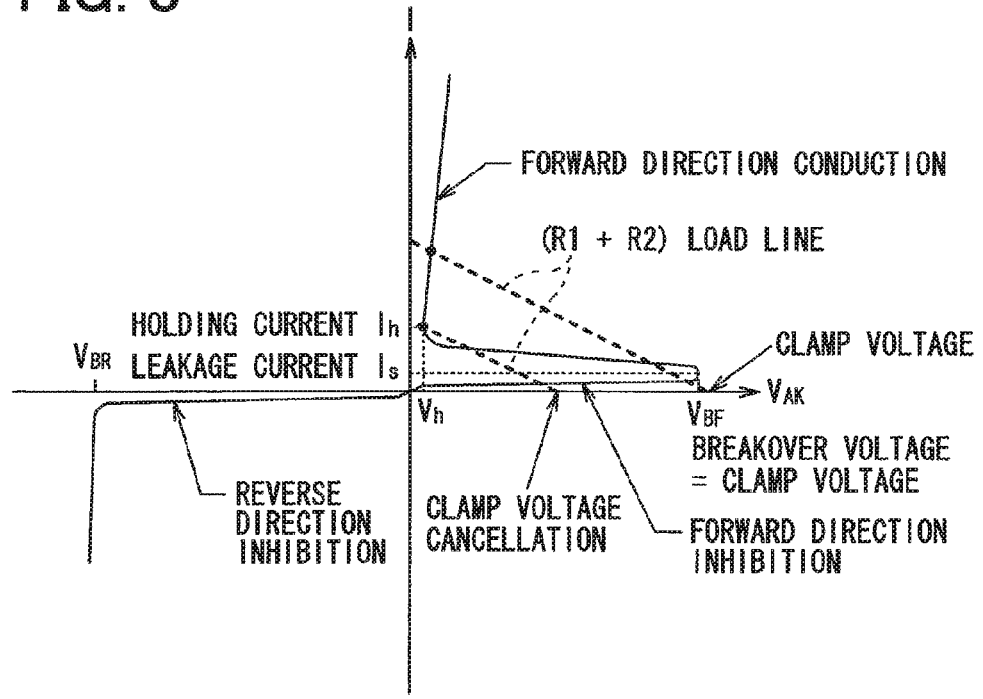
FIG. 3 is a diagram illustrating a relationship between the characteristic line in FIG. 2 and a load line.

For example, since a resistance of the thyristor 2 is small when it is ON and, in the case of a high breakdown voltage element, a breakdown voltage of the diode 5 is sufficiently smaller than that of the thyristor 2, the drop voltage in the thyristor 2 may be almost ignored. Therefore, as in FIG. 3, with the breakover voltage $V_{BF}$ at which the thyristor 2 turns ON being set as the clamp voltage, a load line can be indicated by a line decided by the resistance values R1, R2 of the first resistor 3 and the second resistor 4, and the slope of the load line can be set with these resistance values R1, R2. Therefore, if the resistance values R1, R2 of the first resistor 3 and the second resistor 4 are made small, the current flowing in the protecting element can be made to be a large current; if the resistance values R1, R2 are made large, the current flowing in the protecting element can be made to be a small current.

Specifically, when drawing the load line that is decided according to the resistance values R1, R2 of the first resistor 3 and the second resistor 4 in a graph in which a characteristic line of the thyristor 2 is drawn, intersections of those lines will express the current I flowing in the protecting element and the drop voltage in the thyristor 2 when the thyristor 2 turns ON. That is, a value of the current I at a point where the thyristor 2 and the load line intersect becomes the current that flows when the thyristor 2 turns ON, and a value of the voltage $V_{AK}$ at that time becomes the drop voltage in the thyristor 2. Moreover, the same current I as that of the thyristor 2 will flow in the first resistor 3 and the second resistor 4, and a voltage equal to the clamp voltage from which the voltage drop portion in the thyristor 2 is subtracted will become a voltage drop portion in the first resistor 3 and the second resistor 4 (and the diode 5: a voltage is small compared with the clamp voltage and is almost negligible). Therefore, if the clamp voltage is set to the breakover voltage $V_{BF}$ at which the thyristor 2 turns ON, just by deciding the resistance values R1, R2 of the first resistor 3 and the second resistor 4, the load line according to it is decided; therefore, it is possible to appropriately set the current flowing in the protecting element when the thyristor 2 turns ON. This also makes it possible to supply sufficient electric power to drive the HEMT 1 that is to be protected by adjusting the current flowing in the protecting element.

In contrast, when energy of the inductive load is consumed, the drain voltage tends to descend, and a principal current flowing between the anode and the cathode is equal to or less than the holding current Ih, the thyristor 2 turns OFF. A voltage at which the principal current flowing between the anode and the cathode becomes the current Ih becomes a value obtained by multiplying the resistance values R1, R2 of the first resistor 3 and the second resistor 4 by the current Ih (=(R1+R2)×Ih) (actually, a voltage obtained by further adding the breakdown voltage of the diode 5 to this voltage). This becomes a clamp cancellation voltage at which the clamping is cancelled. Thus, after the energy of the inductive load is consumed and the drain voltage falls, it is also possible to make the HEMT 1 turn ON by the thyristor 2 turning off and make the HEMT 1 return to a normal off mode automatically.

Incidentally, since the gate voltage Vg during the clamping is given by R2/(R1+R2)×(clamp voltage)+(breakdown voltage of diode 5) using the resistance value R1 of the first resistor 3 and the resistance value R2 of the second resistor 4, the gate voltage Vg is freely settable by adjusting the resistance value R2.

In this embodiment, the protection circuit is thus configured so as to have the thyristor 2 and the first resistor 3 between the drain and the gate of the HEMT 1 as the protecting element and have the second resistor 4 and the diode 5 between the source and the gate of the HEMT 1. Therefore, it is possible to configure the protection circuit so that at the time of turn-off of the HEMT 1, the thyristor 2 may turn ON and a current can flow into the protecting element side, and so that the HEMT 1 can be made to turn ON by the gate voltage Vg that is formed by voltage division with the first resistor 3 and the second resistor 4 at that time. This enables, at the time of turn-off, the energy accumulated in the inductive load to be consumed by turning on the HEMT 1 while avoiding a voltage exceeding the blocking voltage from being applied to the HEMT 1 using the forward-direction breakdown voltage of the thyristor 2 as the clamp voltage. Therefore, it becomes possible to improve the protection circuit to be the protection circuit of a semiconductor device that can obtain avalanche maximum energy.

Moreover, in such a protection circuit, the protecting element can be constructed with the thyristor 2, the first resistor 3, the second resistor 4, and the diode 5, and the diode 5 only needs to have such a low breakdown voltage as can perform gate driving of the HEMT 1; therefore the number of stages of the diodes can be reduced. Therefore, it also becomes possible to suppress increase in size of the protecting element.

Therefore, it becomes possible to improve the protection circuit to be the protection circuit of a semiconductor device that can obtain the avalanche maximum energy while suppressing the increase in size of the protecting element.

Other Embodiments

The present disclosure is not limited to the above-mentioned embodiments, and can be suitably altered within a range that is described in what is claimed is.

Figure 4:
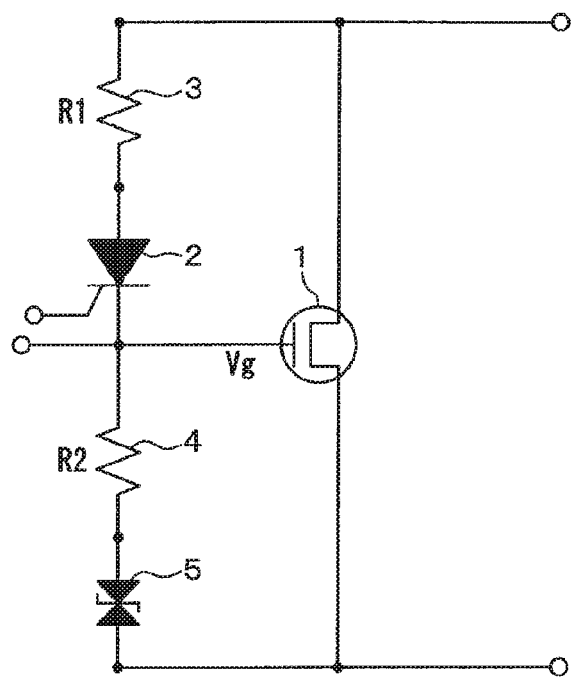
FIG. 4 is a circuit diagram of a protection circuit of a semiconductor device according to other embodiments.

For example, in the embodiment, as in FIG. 4, the thyristor 2 may be arranged at the low side of the first resistor 3 and yet at the high side of the gate of the HEMT 1.

Figure 5:
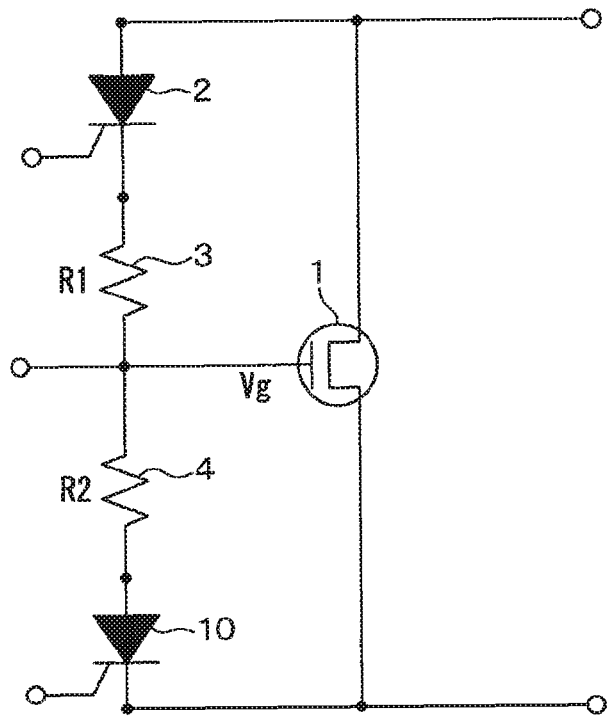
FIG. 5 is a circuit diagram of a protection circuit of a semiconductor device according to the other embodiments.

Moreover, as in FIG. 5, a thyristor 10 may be arranged as the interrupter instead of the diode 5. In this case, the thyristor 10 is configured so that the voltage that is divided by the first resistor 3 and the second resistor 4 may be applied to the gate of the HEMT 1 by the thyristor 10 performing the same operation as that of the thyristor 2 when the HEMT 1 is made to turn OFF, and thereby the HEMT 1 can be turned OFF. Thereby, it is possible to achieve the same effect as that of the first embodiment. Moreover, also in this case, since it is sufficient for the thyristor 2 to have such a low breakdown voltage as can perform the gate driving of the HEMT 1, it also becomes possible to suppress the increase in size of the protecting element. Incidentally, regarding a base of the thyristor 10, it can be chosen whether the base is set to the open state according to the leakage current $I_s$ and the breakdown voltage or the base is short-circuited to a cathode of the thyristor 10.

Figure 6:
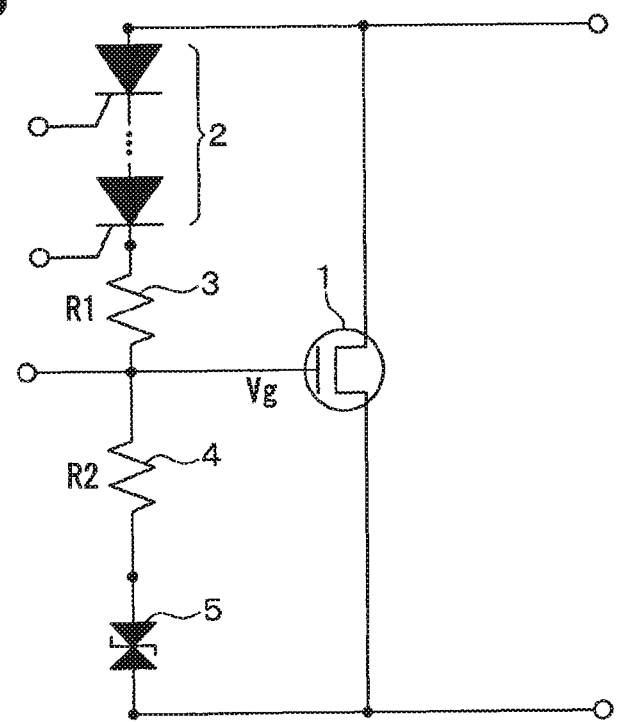
FIG. 6 is a circuit diagram of a protection circuit of a semiconductor device according to the other embodiments.

Furthermore, the thyristor 2 may be configured to be in multiple stages of thyristors as in FIG. 6.

The invention claimed is:

1. A protection circuit of a semiconductor device, comprising:

a high electron mobility transistor as a semiconductor switching element that is connected to a load and turns on or off an electric power supply to the load; and a protecting element that includes:

a thyristor connected in a forward direction and a first resistor connected in series to the thyristor between a drain and a gate of the high electron mobility transistor; and a second resistor and an interrupter connected in series to the second resistor between a source and the gate of the high electron mobility transistor, wherein the interrupter interrupts a flow of a current between the drain and the gate of the high electron mobility transistor when the thyristor is turned off, and wherein the interrupter permits the flow of the current between the drain and the gate of the high electron mobility transistor when the thyristor is turned on;

wherein a drain voltage of the high electron mobility transistor when turning off the high electron mobility transistor is clamped at a clamp voltage equal to a forward breakdown voltage of the thyristor.

2. The protection circuit of the semiconductor device according to claim 1, wherein the first resistor has a resistance value defined as R1, wherein the second resistor has a resistance value defined as R2, wherein a holding current in the thyristor is defined as Ih, and wherein a clamp cancellation voltage at which clamping is cancelled is set to a value satisfying an equation of (R1+R2)×Ih.

3. The protection circuit of the semiconductor device according to claim 1, wherein the first resistor has a resistance value defined as R1, wherein the second resistor has a resistance value defined as R2, wherein the clamp voltage is defined as Vc, and wherein a gate voltage of the high electron mobility transistor is set to a value satisfying an equation of R2/(R1+R2)×Vc when the drain voltage of the high electron mobility transistor is clamped to the clamp voltage.

4. The protection circuit of the semiconductor device according to claim 1, wherein the thyristor is connected to a high side of the first resistor.

5. The protection circuit of the semiconductor device according to claim 1, wherein the thyristor is connected to a low side of the first resistor.

6. The protection circuit of the semiconductor device according to claim 1, wherein a diode as the interrupter and the second resistor are connected between the source and the gate of the high electron mobility transistor.

7. The protection circuit of the semiconductor device according to claim 1, wherein a thyristor as the interrupter and the second resistor are connected between the source and the gate of the high electron mobility transistor.

8. The protection circuit of the semiconductor device according to claim 1, wherein a base of the thyristor is in an open state or is short-circuited to a cathode of the thyristor.

9. The protection circuit of the semiconductor device according to claim 1,
   wherein an anode of the thyristor is connected to the drain of the high electron mobility transistor.

\* \* \* \* \*